US008922277B2

(12) United States Patent
Park

(10) Patent No.: US 8,922,277 B2
(45) Date of Patent: *Dec. 30, 2014

(54) SWITCHING POWER AMPLIFIER AND METHOD OF CONTROLLING THE SAME

(71) Applicant: Samsung Electronics Co., Ltd., Suwon-si (KR)

(72) Inventor: Hae-kwang Park, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/775,816

(22) Filed: Feb. 25, 2013

(65) Prior Publication Data

US 2013/0169356 A1   Jul. 4, 2013

Related U.S. Application Data

(63) Continuation of application No. 12/503,978, filed on Jul. 16, 2009, now Pat. No. 8,410,845.

(30) Foreign Application Priority Data

Jul. 16, 2008   (KR) .......................... 10-2008-006931
Mar. 31, 2009  (KR) ........................ 10-2009-0027754

(51) Int. Cl.
   *H03F 1/26*     (2006.01)
   *H03F 3/217*    (2006.01)

(52) U.S. Cl.
   CPC ............... *H03F 1/26* (2013.01); *H03F 3/2173* (2013.01); *H03F 3/217* (2013.01)
   USPC ........................................... 330/10; 361/123

(58) Field of Classification Search
   USPC ..................................... 330/10; 381/94.5, 123
   See application file for complete search history.

(56) References Cited

U.S. PATENT DOCUMENTS 5,789,975 A    8/1998   Yoshida et al.
6,297,692 B1  10/2001   Nielsen
(Continued)

FOREIGN PATENT DOCUMENTS

CN    1608343    4/2005
CN    1347589    5/2005
(Continued)

OTHER PUBLICATIONS

PCT International Search Report issued Mar. 10, 2010 in International Application No. PCT/KR2009/003933.

(Continued)

*Primary Examiner* — Michael Shingleton
(74) *Attorney, Agent, or Firm* — Stanzione & Kim, LLP

(57) ABSTRACT

A switching power amplifier having a pulse width modulation (PWM) signal generation unit that converts an input audio signal into a PWM signal with a predetermined carrier frequency, a correction unit that corrects the difference between an audio signal included in the PWM signal and a negative feedback output audio signal to generate a corrected PWM signal, a low pass filter that removes a high-frequency component from the corrected PWM signal, a frequency modulation unit that modulates the corrected PWM signal so that the corrected PWM signal has a switching frequency different from the carrier frequency of the input PWM signal to generate a modulated PWM signal, and a power amplification unit that amplifies a power of the modulated PWM signal.

7 Claims, 8 Drawing Sheets

(56) References Cited

U.S. PATENT DOCUMENTS

| | | | |
|---|---|---|---|
| 6,504,427 B2 | 1/2003 | Midya et al. | |
| 6,768,779 B1 | 7/2004 | Nielsen | |
| 6,952,131 B2 | 10/2005 | Jeong et al. | |
| 7,598,895 B1 * | 10/2009 | Khoury | 341/152 |
| 8,410,845 B2 * | 4/2013 | Park | 330/10 |
| 2002/0036579 A1 | 3/2002 | Grosso et al. | |
| 2002/0053945 A1 | 5/2002 | Putzeys | |
| 2002/0070799 A1 | 6/2002 | Dahan et al. | |
| 2005/0168204 A1 | 8/2005 | Nielsen et al. | |
| 2006/0091945 A1 | 5/2006 | Wegner | |
| 2008/0024210 A1 | 1/2008 | Park | |
| 2008/0042743 A1 | 2/2008 | Wong et al. | |
| 2010/0013554 A1 * | 1/2010 | Park | 330/10 |
| 2010/0156527 A1 * | 6/2010 | Midya et al. | 330/10 |
| 2012/0161864 A1 * | 6/2012 | Lee et al. | 330/10 |
| 2012/0195441 A1 * | 8/2012 | Moon et al. | 381/98 |
| 2012/0230520 A1 * | 9/2012 | Lim | 381/123 |
| 2013/0169356 A1 * | 7/2013 | Park | 330/10 |

FOREIGN PATENT DOCUMENTS

| | | |
|---|---|---|
| CN | 101127510 | 2/2008 |
| EP | 1653604 | 5/2006 |
| JP | 06-244654 | 9/1994 |
| JP | 09-130160 | 5/1997 |
| JP | 11-031928 | 2/1999 |
| JP | 2001-517393 | 10/2001 |
| JP | 2002-353750 | 12/2002 |
| JP | 2004-128750 | 4/2004 |
| JP | 2006-121529 | 5/2006 |
| JP | 2006-191250 | 7/2006 |
| JP | 2008-048262 | 2/2008 |
| KR | 10-0765792 | 10/2007 |
| WO | 98-44626 | 10/1998 |
| WO | 2008/075318 | 6/2008 |

OTHER PUBLICATIONS

European Office Action Issued on Jun. 20, 2012 in EP Patent Application No. 09798129.4.
Indonesian Office Action Issued on Jun. 18, 2012 in ID Patent Application No. W-00201100192.
Extended European Search Report issued in European Patent Application No. 09798129.4 on Nov. 8, 2011.
CN Office Action issued in 200980127902.9 dated Nov. 14, 2012.
Chinese Office Action dated May 16, 2013 issued in CN Application No. 200980127902.9.
JP Office Action dated Jul. 23, 2013 issued in Japanese Application No. 2011-518654.
Office Action issued in Japanese Application No. 2011-518654 on May 13, 2014.

* cited by examiner

SWITCHING POWER AMPLIFIER AND METHOD OF CONTROLLING THE SAME

CROSS-REFERENCE TO RELATED APPLICATIONS

This application is a Continuation Application of prior application Ser. No. 12/503,978, filed on Jul. 16, 2009 in the United States Patent and Trademark Office, which claims the benefit under 35 U.S.C. §119(a) Korean Patent Application No. 10-2008-0069311, filed on Jul. 16, 2008, and Korean Patent Application No. 10-2009-0027754, filed on Mar. 31, 2009, in the Korean Intellectual Property Office, the disclosures of which are incorporated herein in their entirety by reference.

BACKGROUND

1. Field of the Invention

The present general inventive concept relates to a switching power amplifier, and more particularly, to a switching power amplifier that removes non-linearity of a power amplification unit by converting an input audio signal into a pulse width modulation (PWM) signal, removing a carrier frequency from a the PWM signal, and modulating the PWM signal so that the PWM signal has a new frequency for operation of a power stage.

2. Description of the Related Art

Class-A power amplifiers, class-B power amplifiers, and class-AB power amplifiers are generally used as linear analog power amplifiers. These linear analog power amplifiers have good linearity but provide low efficiency, thus resulting in large power loss. To address this problem, switching power amplifiers (also referred to as class-D power amplifiers) providing high efficiency have been proposed. These switching power amplifiers basically change an input signal into a pulse width modulation (PWM) signal, and amplify the input signal using a power switch stage. However, the performance of switching power amplifiers may be degraded due to the non-linearity of the power switch stage. The non-linearity of the power switch stage degrades the total harmonic distortion (THD) and generates out of band noise, thereby degrading the signal-to-noise ratio (SNR). In addition, noise is generated in an output signal due to the non-linearity and ripple of the power unit connected to the power switch stage of the switching power amplifiers.

SUMMARY

The present general inventive concept provides a switching power amplifier that changes the frequency of a pulse width modulation (PWM) signal input to a power stage in order to remove non-linearity of the switching power amplifier, and a method of controlling the switching power amplifier.

Additional features and/or utilities of the present general inventive concept will be set forth in part in the description which follows and, in part, will be obvious from the description, or may be learned by practice of the general inventive concept.

Exemplary embodiments of the present general inventive concept provide a switching power amplifier including: a pulse width modulation (PWM) signal generation unit to convert an input audio signal into a PWM signal having a predetermined carrier frequency; a correction unit to correct a difference between an audio signal included in the PWM signal and a negative feedback output audio signal in order to generate a corrected PWM signal; a low pass filter to remove a high-frequency component from the corrected PWM signal; a frequency modulation unit to modulate the corrected PWM signal so that the corrected PWM signal has a switching frequency different from the carrier frequency of the input PWM signal; and a power amplification unit to amplify the power of the modulated PWM signal.

According to embodiments of the present general inventive concept, an input PWM signal is modulated to have a switching frequency different from a carrier frequency component originally included in the input PWM signal, thereby improving the frequency characteristics of a power amplification unit and correcting the non-linearity of the power amplification unit.

Exemplary embodiments of the present general inventive concept provide a switching power amplifier including a digital signal generation unit to convert an input pulse code modulation (PCM) signal into a pulse width modulation (PWM) signal, the signal generation unit including an upsampling unit to upsample the input PCM signal; a sample transformation unit to transform the upsampled input PCM signal into a transformed PCM signal having a carrier frequency; a noise shaping unit to remove a quantization noise component of the transformed PCM signal from an audible band; and a PWM unit to convert the transformed PCM signal into a PWM signal having the carrier frequency.

The digital signal generation unit can further include a frequency modulation unit to remove the carrier frequency from the PWM signal and to add a switching frequency to the PWM signal; and an amplifier to amplify a power of the PWM signal at the switching frequency.

Exemplary embodiments of the present general inventive concept provide a switching power amplifier including a signal generation unit to convert an input pulse code modulation (PCM) signal into a pulse width modulation (PWM) signal having a predetermined frequency; a frequency modulation unit to remove the carrier frequency from the PWM signal and to add a switching frequency to the PWM signal; and an amplifier to amplify a power of the PWM signal at the switching frequency to generate the amplified signal.

The frequency modulation unit can further include a correction unit to sum the difference between the PWM signal and an amplified signal and the PWM signal; a low pass filter to remove the predetermined frequency from the PWM signal; and a modulation unit to add a switching frequency to the PWM signal The frequency modulation unit can further include an operational amplifier to receive the PWM signal and to output a modulated PWM signal; a first negative feedback path, connected to the positive terminal of the operational amplifier, to remove the predetermined frequency from the PWM signal and to add a switching frequency to the PWM signal; and a second negative feedback path, connected to the positive terminal of the operational amplifier, to carry the modulated PWM signal and to correct an error between the PWM signal and the modulated PWM signal.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
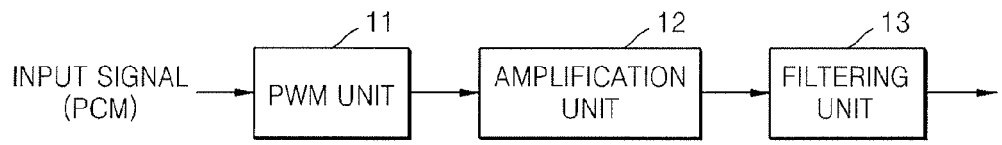
FIG. 1 is a block diagram illustrating a switching power amplifier in the related art.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a block diagram of an example of a switching power amplifier in the related art. A switching power amplifier uses a pulse width modulation (PWM) method in which amplification is performed by switching. Referring to FIG. 1, a PWM unit 11 modulates an input signal PCM into a PWM signal, an amplification unit 12 amplifies the input signal according to a switching operation depending on the PWM signal, and a filtering unit 13, which may be a low-pass filter, extracts an audio waveform from the amplified input signal. As described above, the conventional switching power amplifier of FIG. 1 generates distortion of an output signal due to the non-linearity of the amplification unit 12.

In order to prevent the distortion caused by the non-linearity of the amplification unit 12, a feedback controlling method that uses a negative feedback has been used in the related art.

Figure 2:
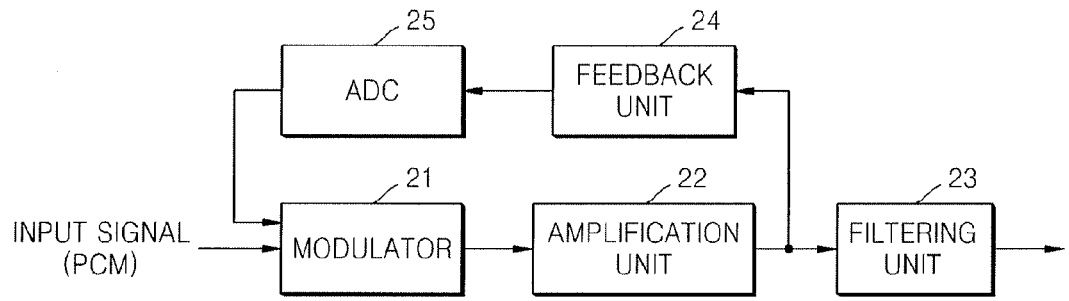
FIG. 2 is a block diagram illustrating another switching power amplifier in the related art.
Figure 3:
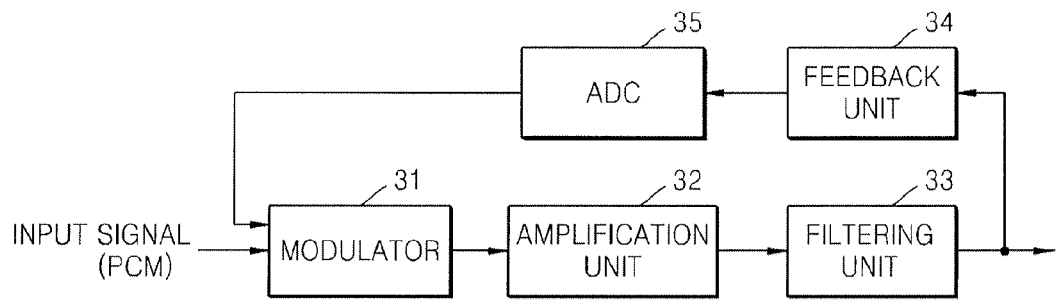
FIG. 3 is a block diagram illustrating another switching power amplifier in the related art.

FIGS. 2 and 3 are block diagrams of other examples of a switching power amplifier in the related art.

Referring to FIGS. 2 and 3, in the related art, in order to prevent distortion caused by the non-linearity of a switching power amplifier, an amplified signal output from an amplification unit 22 is negatively fed back by a feedback unit 24, or an output of a filtering unit 33 is negatively fed back by a feedback unit 34. In the related art, the difference between the input signal and the output signal is subtracted from or added to the input signal in order to correct the non-linearity of a system. As shown in the switching power amplifiers of FIGS. 2 and 3 in the related art, analog-to-digital converters (ADCs) 25 and 35 are needed on the feedback paths, respectively. The inclusion of the ADCs 25 and 35 causes signal delay and increases in the manufacturing costs and sizes of the switching power amplifiers.

In addition, the switching power amplifiers of FIGS. 2 and 3 fail to compensate for an error source existing within amplification units 22 and 32. As described above, in a switching power amplifying operation of a digital amplifier, non-linearity and noise are generated in an output signal. The non-linearity is caused due to characteristics of transistors such as metal oxide semiconductor field effect transistors (MOSFETs) that constitute the amplification unit, including a difference between rising periods of time of the transistors during switching, a difference between falling periods of time of the transistors during switching, and other factors. The non-linearity causes out of band quantization noise, thereby degrading not only total harmonic distortion (THD) but also the signal-to-noise ratio (SNR). These switching power amplifiers require a high switching frequency in order to have a good frequency response and low distortion. Most switching power amplifiers use a switching frequency of 100 kHz or greater. This high switching frequency requires each of the components of a switching power amplifier to operate at a high speed. However, the switching power amplifiers of FIGS. 2 and 3 in the related art typically do not operate at a switching frequency of 100 kHz or greater. Instead, the switching operations use PWM signals with fixed frequencies generated by modulators 21 and 31. Thus, it is difficult to generate PWM signals suitable for the frequency characteristics of the components of the switching power amplifier and to use a switching frequency suitable for the frequency characteristics of the amplification units 22 and 32.

Accordingly, the present general inventive concept provides a switching power amplifier that removes a carrier frequency included in an input PWM signal and adds a new switching frequency to the input PWM signal.

The present general inventive concept will now be described more fully with reference to the accompanying drawings, in which exemplary embodiments of the general inventive concept are shown.

Figure 4:
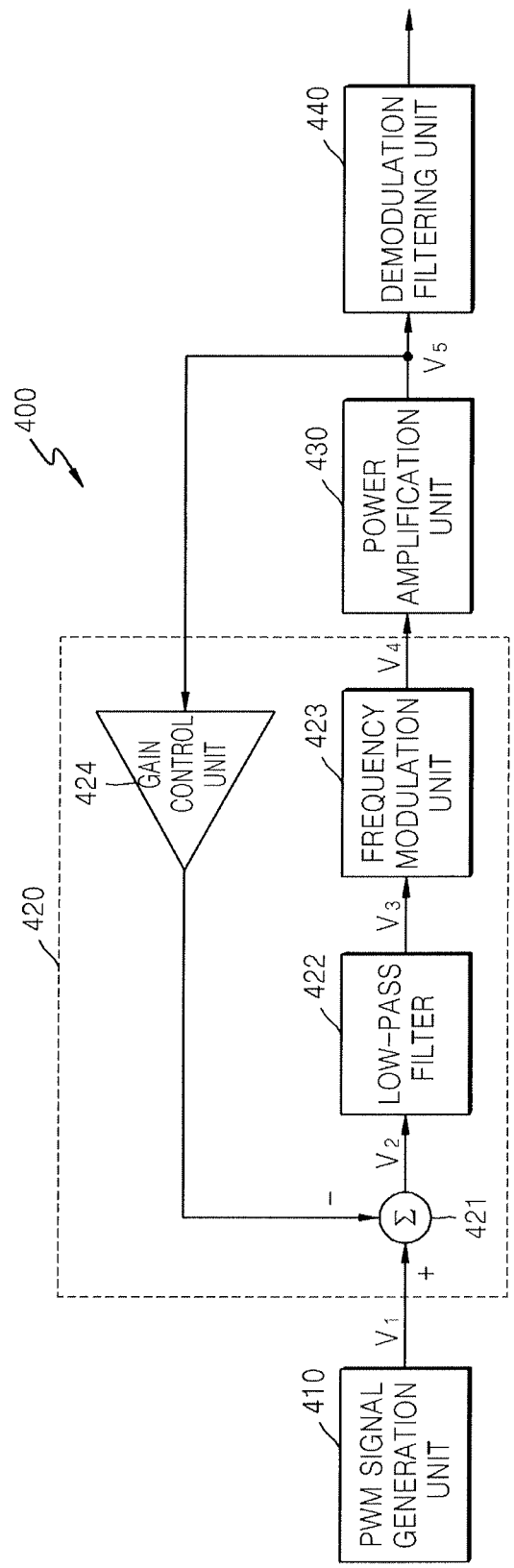
FIG. 4 is a block diagram illustrating a switching power amplifier according to an exemplary embodiment of the present general inventive concept.

FIG. 4 is a block diagram of a structure of a switching power amplifier 400 according to an exemplary embodiment of the present general inventive concept. Referring to FIG. 4, the switching power amplifier 400 may include a PWM signal generation unit 410, an error correction and frequency modulation unit 420, a power amplification unit 430, and a demodulation filtering unit 440.

The PWM signal generation unit 410 converts an input audio signal into a PWM signal $V_1$ having a predetermined carrier frequency and outputs the PWM signal $V_1$ having the predetermined carrier frequency. The input audio signal is a pulse code modulation (PCM) signal which is a digital signal. The PWM signal generation unit 410 converts data which is to be transmitted through the input PCM signal into the PWM signal $V_1$ which is encoded by a pulse width modulation.

Figure 5:
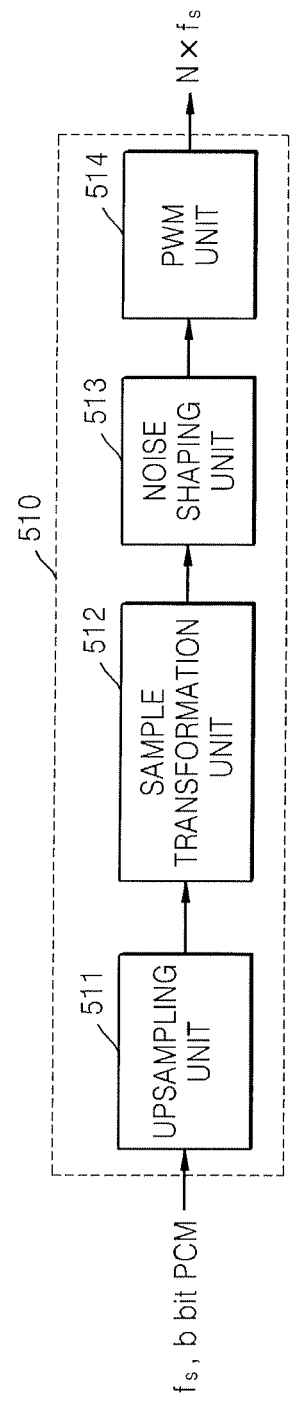
FIG. 5 is a block diagram of a digital pulse width modulation (PWM) signal generation unit according to an exemplary embodiment of the present general inventive concept.
Figure 6:
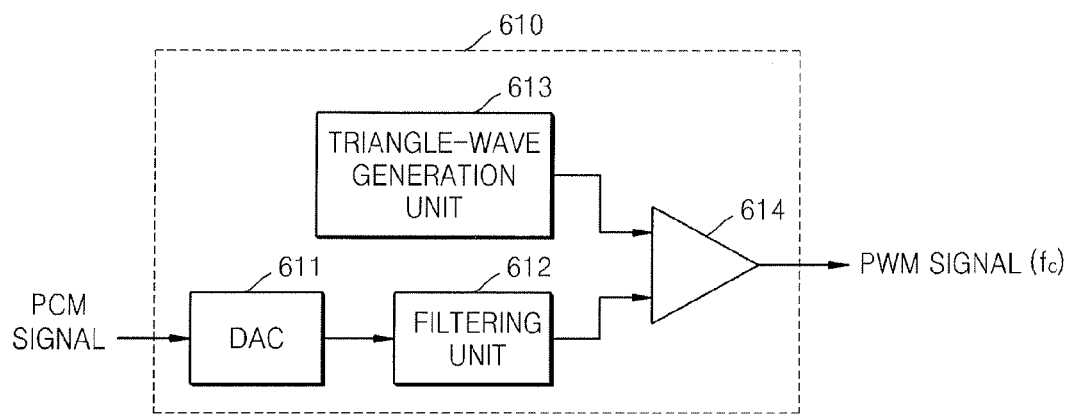
FIG. 6 is a block diagram illustrating an analog PWM signal generation unit according to an exemplary embodiment of the present general inventive concept.

An embodiment of the PWM signal generation unit 410 is exemplarily illustrated in more detail in FIGS. 5 and 6.

FIG. 5 is a block diagram of a digital PWM signal generation unit 510 according to an exemplary embodiment of the present general inventive concept. Referring to FIG. 5, the digital PWM signal generation unit 510 may include an upsampling unit 511, a sample transformation unit 512, a noise shaping unit 513, and a PWM unit 514. When a sampling frequency of an input b-bit PCM signal is fs, the upsampling unit 511 and the sample transformation unit 512 upsample the b-bit PCM signal to output a PCM signal having a frequency of N×fs (where N is an integer) which is higher than the original sampling frequency of fs. The noise shaping unit 513 moves a quantization noise component of an audible band included in the PCM signal output by the sample transformation unit 512, out of the audible band. The PWM unit 514 converts the PCM signal output by the noise shaping unit 513 into a PWM signal and outputs the PWM signal.

FIG. 6 is a block diagram of an analog PWM signal generation unit 610 according to an exemplary embodiment of the present general inventive concept.

Referring to FIG. 6, the analog PWM signal generation unit 610 may include a digital-to-analog converter (DAC) 611, a filtering unit 612, a triangle-wave generation unit 613, and a comparator 614. An input digital PCM signal is converted into an analog PCM signal in the DAC 611, and the analog PCM signal is input to the comparator 614 via the filtering unit 612. The comparator 614 generates an analog PWM signal having a carrier frequency of fc by using a triangle-wave signal having the carrier frequency of fc generated by the triangle-wave generation unit 613 and an analog PCM signal received from the filtering unit 612.

Referring back to FIG. 4, when the PWM signal $V_1$ having the predetermined carrier frequency is generated, the error correction and frequency modulation unit 420 compares the negative feedback output signal $V_5$ with the input PWM signal $V_1$ and corrects the error corresponding to the difference between the two signals. The error correction and frequency modulation unit 420 removes the carrier frequency component from the input PWM signal $V_1$ and adds a switching frequency different from the carrier frequency component to the input PWM signal $V_1$.

More specifically, a correction unit 421 calculates and outputs the difference between the PWM signal $V_1$ output from the PWM signal generation unit 410 and the negative feedback output signal $V_5$ which is output from the power amplification unit 430 and has a gain value controlled by a gain control unit 424. The error corresponding to the difference between the input audio signal included in the PWM signal $V_1$ and the output audio signal included in the negative feedback output signal $V_5$ is corrected by negative feedback. A low-pass filter 422 removes the high frequency component from the corrected PWM signal $V_2$ output from the correction unit 421 and thus only transmits an audio signal component. The high frequency component includes not only the carrier frequency component included in the PWM signal $V_1$ but also a switching frequency component to drive the power amplification unit 430. As described later, in the present exemplary embodiment, the carrier frequency component included in the PWM signal $V_1$ is different from the switching frequency to drive the power amplification unit 430, and thus the corrected PWM signal $V_2$ output from the correction unit 421 includes a low-band audio signal, the carrier frequency component of the PWM signal $V_1$, and the switching frequency component of the negative feedback output signal $V_5$. The low-pass filter 422 removes the carrier frequency component and the switching frequency component, which are high frequency components, from the corrected PWM signal $V_2$ and outputs a corrected PWM signal including only the low-band audio signal.

A frequency modulation unit 423 modulates the corrected PWM signal $V_3$ so that a new switching frequency component different from the carrier frequency component of the PWM signal $V_1$ is added to the corrected PWM signal $V_3$. Various frequency modulating methods may be used to add the new switching frequency component to the corrected PWM signal $V_3$. For example, a sigma delta modulation method may be used. Alternatively, the frequency modulation unit 423 may modulate the corrected PWM signal $V_3$ by using—self-oscillation where an output terminal of the frequency modulation unit 423 is connected to an input terminal of the frequency modulation unit 423 via negative feedback. Other effective modulation methods may be used instead of the methods described herein. A PWM signal $V_4$ output from the frequency modulation unit 423 has a switching frequency different from the carrier frequency of the PWM signal $V_1$. The power amplification unit 430 amplifies the PWM signal $V_4$ according to the switching frequency of the PWM signal $V_4$. The demodulation filtering unit 440 removes the high frequency component from the signal $V_5$ output from the power amplification unit 430. In a PWM-type amplifier, since an output signal is switched at a high speed and the amplitude of a pulse is significantly large, spike pulses can be continuously generated. Accordingly, the PWM-type amplifier may generate electromagnetic interference (EMI) within peripheral components. If the amount of EMI generated is small, the demodulation filtering unit 440 can be excluded from the switching power amplifier 400 illustrated in the FIG. 4.

FIGS. 7A through 7D are reference diagrams illustrating a process of signal processing performed in the switching power amplifier 400 illustrated in FIG. 4.

Figure 7A:
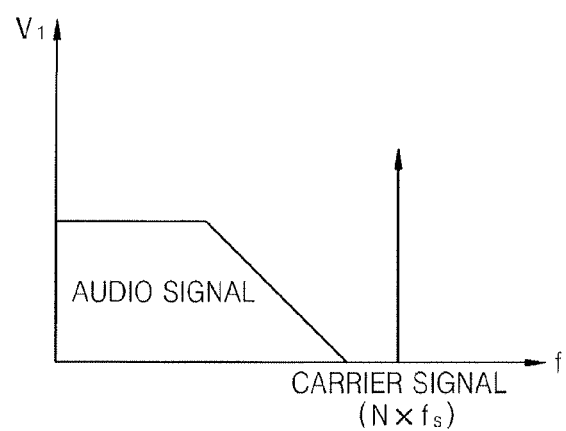
FIGS. 7A through 7D are reference diagrams illustrating a process of signal processing performed in the switching power amplifier illustrated in FIG. 4.
Figure 7B:
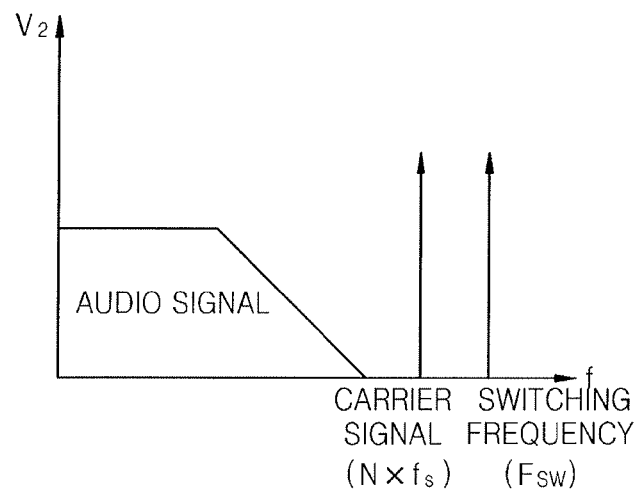
Figure 7C:
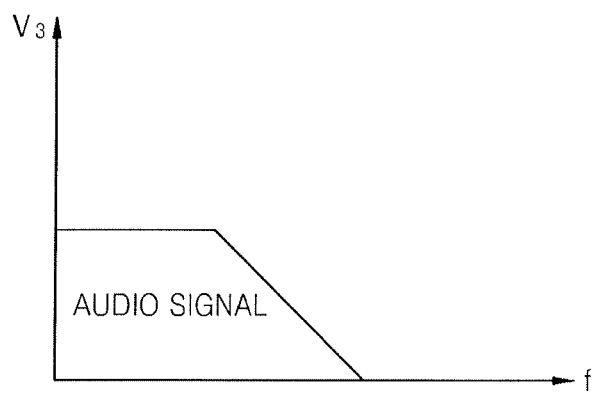
Figure 7D:
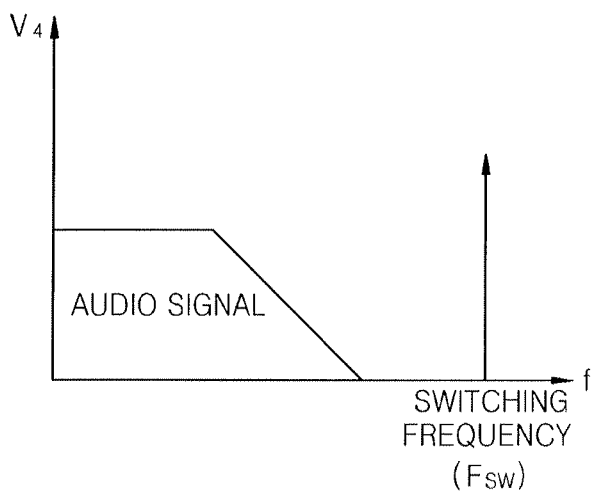

The PWM signal $V_1$ output from the PWM signal generation unit 410 may be viewed in the frequency domain. The PWM signal $V_1$ may be divided into an audio signal component in a low frequency band and a carrier signal component in a high frequency band having a frequency of N×fs as illustrated in FIG. 7A. In the corrected PWM signal $V_2$ corresponding to a difference between the PWM signal $V_1$ and the negative feedback output signal $V_5$ obtained by the correction unit 421, not only the audio signal component and the carrier signal component of the PWM signal $V_1$ but also a switching frequency component Fsw of the negative feedback output signal $V_5$ received through negative feedback co-exist, as illustrated In FIG. 7B. As illustrated in FIG. 7C, the low-pass filter 422 removes the carrier signal component in the high frequency band and the switching frequency component from the corrected PWM signal $V_3$ and thus transmits only the audio signal component. As illustrated in FIG. 7D, to drive the power amplification unit 430, the frequency modulation unit 423 modulates the corrected PWM signal $V_3$ output from the low-pass filter 422 and adds the new switching frequency component Fsw different from the carrier frequency component to the PWM signal $V_1$, thereby outputting the PWM signal $V_4$. As described above, the power amplification unit 430 amplifies the PWM signal $V_4$ by operating at a high frequency using the newly added switching frequency component Fsw.

Figure 8:
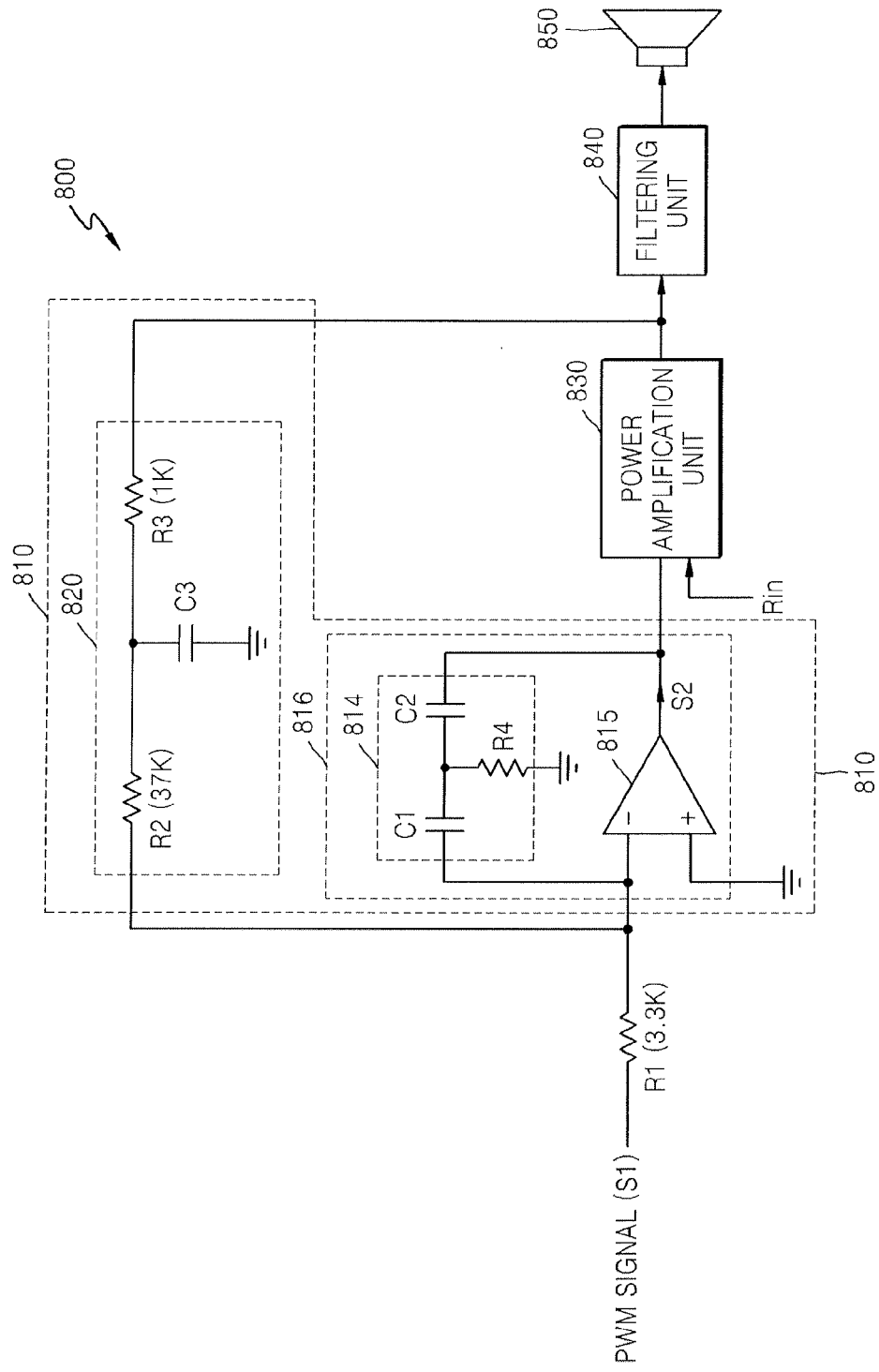
FIG. 8 is a circuit diagram illustrating a part of the switching power amplifier illustrated in FIG. 4 in greater detail.

FIG. 8 is a circuit diagram of a switching power amplifier 800 according to an exemplary embodiment of the present general inventive concept that illustrates an exemplary embodiment of the switching power amplifier 400 of FIG. 4 in greater detail. In FIG. 8, the switching power amplifier 800 is illustrated by focusing on the error correction and frequency modulation unit 810, for convenience of explanation. The error correction and frequency modulation unit 810 corresponds to the error correction and frequency modulation unit 420 of FIG. 4.

As described above, a sigma delta modulation method may be used to add a new switching frequency to a filtered PWM signal. Referring to FIG. 8, a frequency modulation unit 816 may include a first negative feedback path 814 to provide negative feedback of a PWM signal S2, and an OP amplifier 815 to correct an error value and to perform self-oscillation. The OP amplifier 815 calculates a difference between an output PWM signal received via a second negative feedback path 820 and an input PWM signal so as to perform the function of the correction unit 421 of FIG. 4, and also performs the function of the frequency modulation unit 423 of FIG. 4. The first negative feedback path 814 performs the function of the frequency modulation unit 423 in cooperation with the OP amplifier 815 and operates as the low-pass filter 422 of FIG. 4.

An input PWM signal S1 having a predetermined carrier frequency is self-oscillated by the OP amplifier 815 and thus changed into a PWM signal S2 having a switching frequency different from the carrier frequency of the input PWM signal S1. The frequency change of the PWM signal S2 output by the OP amplifier 815 depends on capacitors C1 and C2 and a resistor R4, which are included in the first negative feedback path 814, and the propagation delay of a power amplification unit 830. If the propagation delay of the power amplification unit 830 is sufficiently small, then the frequency f2 of the PWM signal S2 output by the OP amplifier 815 is proportional to a value $(k \times Rin + 2R1 \times C)/(Rin \times 4 \times C1 \times C2)$ regardless of the frequency f1 of the PWM signal S1, where an input impedance of the power amplification unit 830 is Rin, and k denotes a predetermined constant. Accordingly, in embodiments of the present general inventive concept, a new switching frequency to drive the power amplification unit 830 may be set by controlling such parameters as described above.

The value of the switching frequency to drive the power amplification unit 830 may be set to various values. For example, in order to increase the amplification efficiency of the power amplification unit 830, the parameters may be set so that the switching frequency of the PWM signal S2 has a value smaller than that of the carrier frequency of the PWM signal S1. Alternatively, in order to amplify a PWM signal within a wide-band frequency range, the values of the resistor R4 and the capacitors C1 and C2 of the error correction and frequency modulation unit 810 may be set so that the switching frequency of the PWM signal S2 has a value greater than that of the carrier frequency of the PWM signal S1.

Although FIG. 8 illustrates an application of a second order sigma delta modulation method, the present general inventive concept is not limited to the second order sigma delta modulation method, and a PWM signal having a switching frequency different from the frequency of an input PWM signal may be generated using a higher order sigma delta modulation method. As described above, the power amplification unit 830 is switched on by the PWM signal S2 having the newly added switching frequency output by the error correction and frequency modulation unit 810, and outputs a power-amplified PWM signal.

The second negative feedback path 820 transmits the power-amplified PWM signal output by the power amplification unit 830 to the negative terminal of the OP amplifier 815 of the error correction and frequency modulation unit 810. The second negative feedback path 820 is used to control the gain value of the power-amplified PWM signal S2 output by the power amplification unit 830 and correct the error between the gain-controlled power-amplified PWM signal S2 and the PWM signal S1 input to the second negative feedback path 820.

Figure 9:
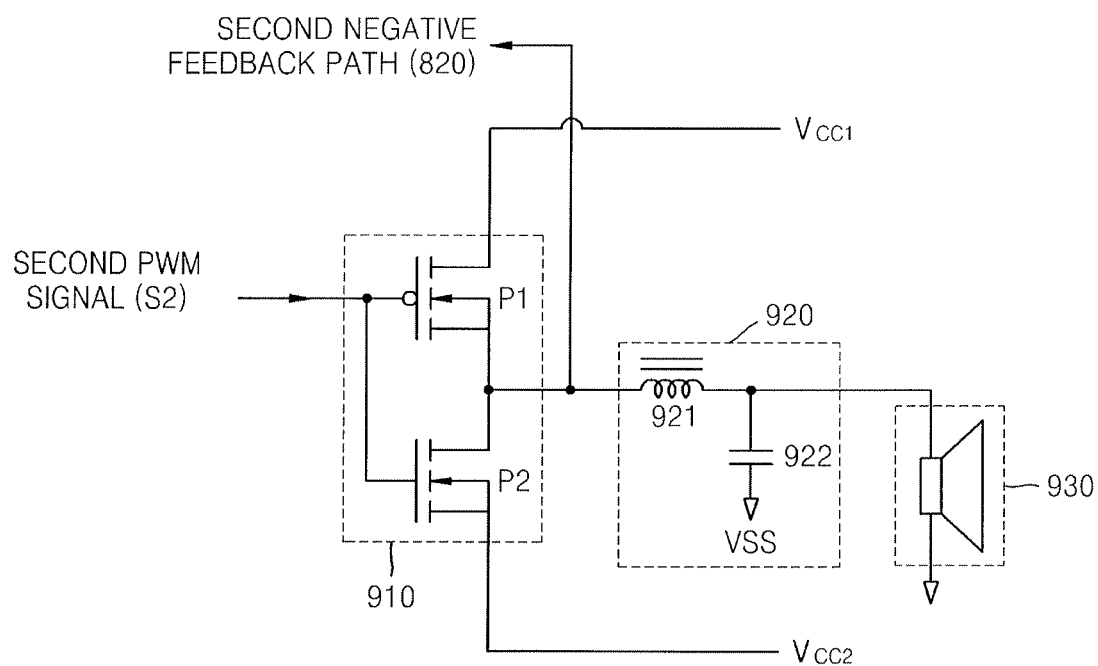
FIG. 9 is a circuit diagram illustrating an exemplary embodiment of a power amplification unit and a demodulation filtering unit included in the switching power amplifier illustrated in FIG. 4.

FIG. 9 is a circuit diagram of an exemplar embodiment of the power amplification unit 430 and the demodulation filtering unit 440 of the switching power amplifier 400 of FIG. 4. Referring to FIG. 9, a power amplification unit 910, which is an exemplary embodiment of the power amplification unit 430, may include two FET transistors P1 and P2. The FET transistors P1 and P2 of the power amplification unit 910 operate in a push-pull mode by the second PWM signal S2 having a new switching frequency set by the error correction and frequency modulation unit 810. In other words, the power amplification unit 910 amplifies the power of the second PWM signal S2 by repeating an operation in which, when the FET transistor P1 is switched on, the FET transistor P2 is switched off, and when the FET transistor P2 is switched on, the FET transistor P1 is switched off.

A filtering unit 920, which is an exemplary embodiment of the filtering unit 440, may include an inductor 921 and a capacitor 922, and removes the high frequency component from the output signal of the power amplification unit 910.

According to the above-described embodiments, an input PWM signal is modulated to have a switching frequency different from the carrier frequency component originally included in the input PWM signal, thereby improving the frequency characteristics of a power amplification unit and correcting the non-linearity of the power amplification unit.

Figure 10:
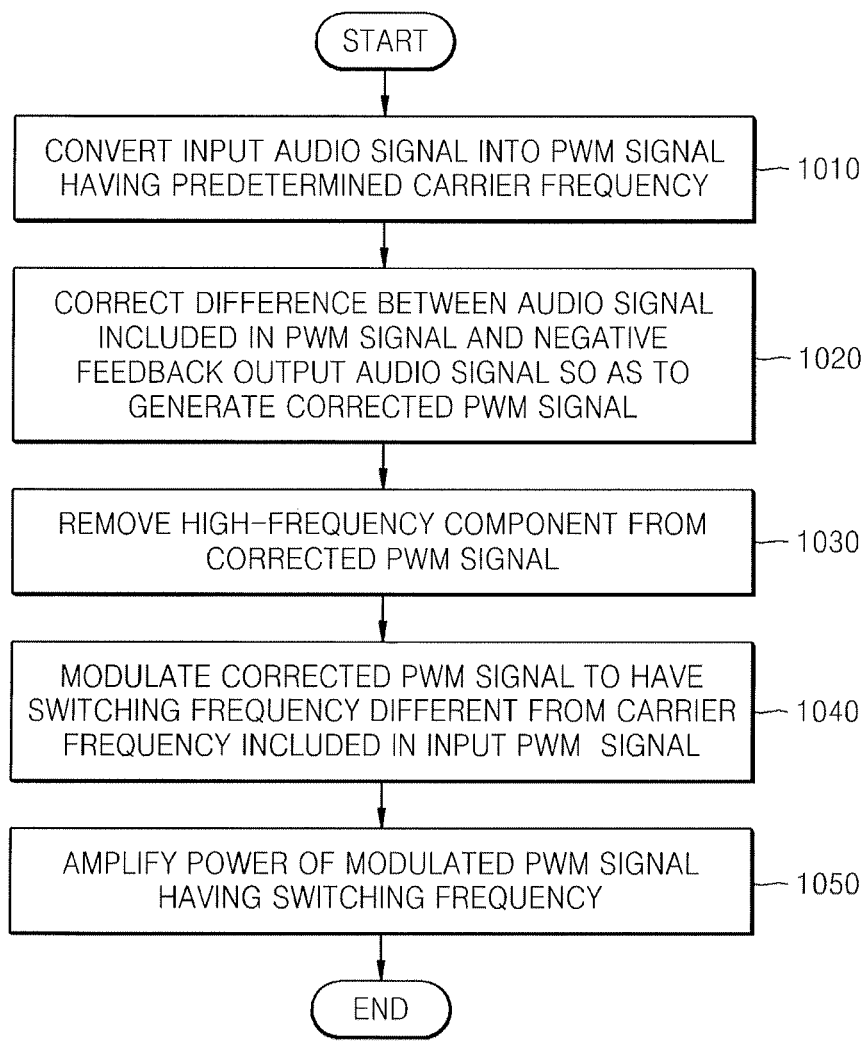
FIG. 10 is a flowchart of a method of controlling a switching power amplifier, according to an exemplary embodiment of the present general inventive concept.

FIG. 10 is a flowchart of a method of controlling a switching power amplifier, according to an exemplary embodiment of the present general inventive concept.

Referring to FIG. 10, in operation 1010, an input audio signal is converted into a PWM signal having a predetermined carrier frequency.

In operation 1020, the difference between an audio signal included in the PWM signal and a negative feedback output audio signal is corrected to generate a corrected PWM signal. More specifically, the input PWM signal is compared with the output PWM signal through negative feedback from a power amplification unit, and the difference between the input PWM signal and the negative feedback output PWM signal is subtracted from or added to the input PWM signal, thereby correcting the error corresponding to the difference.

In operation 1030, the high-frequency component is removed from the corrected PWM signal by using a low-pass filter. As described above, since the carrier frequency included in the input PWM signal and the switching frequency for driving the power amplification unit are different, the corrected PWM signal, which is output by the correction unit, includes a low-band audio signal, a carrier component of the input PWM signal, and a switching frequency component of the output PWM signal. Accordingly, the carrier component and the switching frequency component, which are high-frequency components, are removed from the corrected PWM signal by the low-pass filter, and thus only the low-band audio signal is output.

In operation 1040, the corrected PWM signal is modulated to have a switching frequency different from the carrier frequency included in the input PWM signal. Since the switching frequency component, which is a high-frequency component, has been removed in operation 1030, a new switching frequency for driving the power amplification unit may be added to the corrected PWM signal. Thus, modulation in which a new switching frequency component is added to the corrected PWM signal may be performed according to a sigma delta modulation method, by self-oscillation, or by any other effective modulation method.

In operation 1050, the power amplification unit amplifies the modulated PWM signal.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A switching power amplifier, comprising:
a pulse width modulation (PWM) signal generation unit which converts an input audio signal into a PWM signal having a first carrier frequency;
an error correction and frequency modulation unit including an operational amplifier which corrects a difference between the PWM signal having first carrier frequency and a power-amplified PWM signal received from a gain-control negative feedback path to generate a corrected PWM signal, and modulates the corrected PWM signal by removing the first carrier frequency component from the corrected PWM signal and adding a second carrier frequency component to the corrected PWM signal; and a power amplification unit to amplify a power of the modulated PWM signal from the error correction and frequency modulation unit to the gain-control negative feedback path.

2. The switching power amplifier of claim 1, wherein the frequency modulation unit modulates the corrected PWM signal according to a sigma delta modulation method.

3. The switching power amplifier of claim 1, wherein the frequency modulation unit modulates the corrected PWM signal by using a self-oscillation.

4. The switching power amplifier of claim 3, wherein an output terminal of the frequency modulation unit is connected to an input terminal of the frequency modulation unit through negative feedback.

5. The switching power amplifier of claim 1, wherein the PWM signal is a digital signal.

6. The switching power amplifier of claim 1, further comprising:

a gain control unit installed on a negative feedback path for an output signal from the power amplification unit, the gain control unit controlling a gain value of the output signal.

7. The switching power amplifier of claim 1, further comprising:

a signal generation unit to convert an input pulse code modulation (PCM) signal into the PWM signal having the first frequency.

* * * * *

UNITED STATES PATENT AND TRADEMARK OFFICE
CERTIFICATE OF CORRECTION

| | |
|---|---|
| PATENT NO. | : 8,922,277 B2 |
| APPLICATION NO. | : 13/775816 |
| DATED | : December 30, 2014 |
| INVENTOR(S) | : Hae-kwang Park |

It is certified that error appears in the above-identified patent and that said Letters Patent is hereby corrected as shown below:

ON THE TITLE PAGE ITEM (30)

Delete "10-2008-006931" and insert --10-2008-0069311--, therefor.

Signed and Sealed this
Twentieth Day of October, 2015

Michelle K. Lee
*Director of the United States Patent and Trademark Office*